United States Patent [19]
Maeda et al.

[11] Patent Number: 5,324,539
[45] Date of Patent: Jun. 28, 1994

[54] METHOD FOR FORMING CVD THIN GLASS FILMS

[75] Inventors: Kazuo Maeda; Noboru Tokumasu; Yuko Nishimoto, all of Tokyo, Japan

[73] Assignees: Semiconductor Process Laboratory; Canon Sales Co., Inc.; Alcan Tech. Co., Inc., all of Japan

[21] Appl. No.: 949,807

[22] PCT Filed: Apr. 14, 1992

[86] PCT No.: PCT/JP92/00467
§ 371 Date: Dec. 16, 1992
§ 102(e) Date: Dec. 16, 1992

[30] Foreign Application Priority Data
Apr. 15, 1991 [JP] Japan .................................. 3-82532

[51] Int. Cl.$^5$ .............................................. C23C 16/00
[52] U.S. Cl. ........................... 427/255.3; 427/255.2; 427/255.1; 427/248.1; 65/60.5; 65/60.52; 65/60.8
[58] Field of Search ............... 427/255.3, 255.2, 255.1, 427/248.1; 65/60.5, 60.52, 60.8; 118/715, 725, 726; 437/238, 240, 236

[56] References Cited

U.S. PATENT DOCUMENTS

| | | | |
|---|---|---|---|
| 4,791,005 | 12/1988 | Becker et al. | 427/255.3 |
| 4,845,054 | 7/1989 | Mitchener | 437/238 |
| 5,028,566 | 7/1991 | Lagendijk | 437/238 |

FOREIGN PATENT DOCUMENTS 60-226428 11/1985 Japan .

OTHER PUBLICATIONS

Yamaguchi et al, "Superconducting properties of $Ba_2YCu_3O_{7-x}$ thin films prepared by chemical vapor deposition on $SrTiO_3$ and metal substrate," Appl. Phys. Lett. vol. 55, No. 15, Oct. 1989 pp. 1581–1582.

*Primary Examiner*—Roy V. King
*Attorney, Agent, or Firm*—Lorusso & Loud

[57] ABSTRACT

The present invention provides a method for forming a chemical vapor deposition film which is suitable for an interlevel insulator between Al and Al or an interlevel insulator between Al and a gate, and provides an improved chemical vapor deposition film suitable for mass production. An organic siloxane or alkoxysilane and an alkoxy compound of germanium are mixed in a vapor phase, and reacted with oxygen or ozone to thereby form a thin glass film composed of a two-component system of silicon oxide and germanium oxide on a substrate.

14 Claims, 7 Drawing Sheets

| No | TEOG FLOW RATE (SLM) | DEPOSITION RATE (Å/min.) | FILM COMPOSITION RATIO (MOL %) | | | | REFRACTIVE INDEX | STRESS (dyne/cm$^2$) |
|---|---|---|---|---|---|---|---|---|
| | | | B | P | Ge | | | |
| 1 | 0 | 1550 | 10.3 | 6.0 | 0 | | 1.466 | $1.2 \times 10^9$ |
| 2 | 1 | 1500 | 8.8 | 9.0 | 0.3 | | 1.477 | $1.0 \times 10^9$ |
| 3 | 2 | 1530 | 10.4 | 6.7 | 0.8 | | 1.477 | $0.9 \times 10^9$ |
| 4 | 3 | 1580 | — | 8.9 | 2.6 | | 1.477 | $0.8 \times 10^9$ |
| 5 | 4 | 1640 | 7.2 | 9.2 | 4.3 | | 1.473 | $0.7 \times 10^9$ |

FIG. 7

METHOD FOR FORMING CVD THIN GLASS FILMS

BACKGROUND OF THE INVENTION

The present invention relates to a method for forming a Chemical Vapor Deposition (CVD) film and an apparatus for manufacturing a semiconductor device with formation of an interlevel insulator in the semiconductor device.

There are a variety of CVD systems for forming an insulating film, but a plasma CVD method and a thermal CVD method have been principally used in recent years. However, an insulating film formed by the plasma CVD method is not suitable for a highly dense and fine pattern such as a very large scale integrated circuit (VLSI), in particular a dynamic random access memory (DRAM), since such insulating film has poor step coverage and contains impurities such as carbon (C).

Accordingly, attention has focused on application of the thermal CVD method because of its superior step coverage, in particular the thermal CVD method which enables film formation at such a low temperature that no thermal influence is exerted upon other components in forming a VLSI such as a DRAM.

Conventional methods include (a) a method involving oxidizing $SiH_4$ or oxidizing $SiH_4$ after mixing $PH_3$ and $B_2H_4$ therewith, and (b) a method involving pyrolyzing or oxidizing alkoxysilane $Si(OR)_4$ or oxidizing $Si(OR)_4$ after mixing $B(OR)_3$ and $PO(OR)_3$ therewith. Both (a) and (b) are conventional thermal CVD methods for forming a $SiO_2$ film or an insulating film with a $SiO_2$ film as the base.

Interlevel insulators are formed between Al and a gate and between Al and Al.

(1) For an interlevel isolator between Al and Al, the following are the criteria:
  growth at a low temperature should be possible;
  the film should have low stress and low damage;
  the film should be highly dense and have controlled hillock of Al;
  the film should have stable electric characteristics;
  the film should have a flat characteristic;
  the film should have few pin-holes;
  the particle generation density should be low; and
  the film should have high durability.

(2) For an interlevel insulator between Al and a gate, the following are the criteria:
  the film should be capable of reflow at a low temperature;
  the film should show stable electric characteristics;
  the film should have few pin-holes; and
  the particle generation density should be low.

Accordingly, a conventional plasma CVD method or atmospheric pressure CVD method may be used for forming an interlevel insulator between Al and Al, a complicated process wherein three types of a CVD film I 35, CVD film II 36 and a CVD film III 37 are formed on interconnection metals 34 on a substrate 33, as shown in FIG. 8. Optionally, a glass film may be applied midway therebetween for flattening and etch-back as shown in FIG. 9.

The following methods have been proposed for forming an interlevel insulator between Al and a gate:

(1) Formation of an arsenic silicate glass film using $SiH_4$-$AsH_3$-$O_2$.

(2) Formation of a boron silicate glass film using $SiH_4$-$B_2H_6$-$PH_3$-$O_2$.

(3) Formation of a boron arsenic silicate glass film using TEOS-Tri Methyl Borate (TMB)-Tri Methyl Phosphate (TMOP)-$O_3$.

(4) Formation of a boron arsenic silicate glass film using TEOS-TMB-TMOP-$O_2$.

(5) Formation of a germanium silicate glass film using $SiH_4$-$GeH_4$-$PH_3$-$O_2$.

However, since reflow of the interlevel insulator can be performed at a temperature of approximately 800° C. to 900° C. in (1) to (5), it is possible to lower the reflow temperature, which, however, is not sufficient. In particular, the reflow temperature is lowered in (2) to (4) by adding arsenic or boron, but the film quality becomes unstable with the increase of the concentration of arsenic or boron.

Furthermore, according to the method for forming a germanium silicate glass film using $SiH_4$-$GeH_4$-$PH_3$-$O_2$ in (5), there is the problem that the respective compounds are hydrides which are very active and very difficult to handle in practice and, thus, the method is unsuitable for mass production.

The present invention was created to address such various conventional problems, and has for its object provision of an improved method for forming a CVD film And apparatus for manufacturing a semiconductor device suitable for both formation of an interlevel insulator between Al and Al and formation of an interlevel insulator between Al and a gate and also suitable for mass production.

SUMMARY OF THE INVENTION

According to a first embodiment of the method for forming a CVD film of the present invention, an organic silane compound containing siloxane or alkoxysilane and an alkoxy compound of germanium are mixed with each other in a vapor phase, and this vapor phase mixture and ozone are then reacted at atmospheric pressure, to thereby form a thin glass film composed of a two-component system of silicon oxide and germanium oxide on a substrate.

In a second embodiment of the method, an organic silane compound containing siloxane or alkoxysilane and an alkoxy compound of germanium are mixed in a vapor phase, and this vapor phase mixture and oxygen are then reacted at a low pressure, to thereby form a thin glass film composed of a two-component system of silicon oxide and germanium oxide.

In a third embodiment of the method, an organic silane compound containing siloxane or alkoxysilane, an alkoxy compound of germanium, an alkoxy compound or a mixture of an alkoxy compound containing at least either phosphorus or boron, an oxide containing at least either phosphorus or boron and an acid chloride containing at least either phosphorus or boron are mixed and this mixture is reacted with ozone at low pressure, to thereby form a thin glass film composed of a three-component system of silicon oxide, germanium oxide and phosphorus oxide, or a thin glass film composed of three-component system of silicon oxide, germanium oxide and boron oxide, or a thin glass film composed of a four-component system of silicon oxide, germanium oxide, phosphorus oxide and boron oxide on a substrate.

In a fourth embodiment of the method of the invention, an organic silane compound containing siloxane, or alkoxysilane, an alkoxy compound of germanium, an alkoxy compound or a mixture of an alkoxy compound containing at least phosphorus or boron, an oxide containing at least either phosphorus or boron and acid chloride containing at least either phosphorus or boron are mixed with one another, and this mixture is reacted with oxygen at low pressure to thereby form a thin glass film composed of a three-component system of silicon oxide, germanium oxide and phosphorus oxide, or a thin glass film composed of a three-component system of silicon oxide, germanium oxide and boron oxide, or a thin glass film composed of a four-component system of silicon oxide, germanium oxide, phosphorus oxide and boron oxide on the substrate.

An apparatus for manufacturing a semiconductor device of the present invention includes means for feeding an organic silane compound containing siloxane or alkoxysilane, means for feeding an alkoxy compound of germanium, means for feeding oxygen or ozone, and a reaction chamber in which the organic silane compound and the alkoxy compound are mixed in a vapor phase and reacted with ozone at atmospheric pressure or with oxygen at low pressure, and a thin glass film is thereby formed on a substrate in the reaction chamber.

The apparatus may also include means for feeding an alkoxy compound or a mixture of an alkoxy compound containing at least either phosphorus or boron, an oxide containing at least either phosphorus or boron, or acid chloride containing at least either phosphorus or boron, into the reaction chamber for reaction with ozone at atmospheric pressure or with oxygen at low pressure.

In the remarks which follow the operation of the present invention will be explained in accordance with the results of experiments performed by the inventor.

In the present invention respective alkoxy compounds of silicon, phosphorus and boron are used, and an alkoxy compound of germanium is mixed with these compounds for reaction to form a CVD film.

Thus, the mixed gas contains alkoxy compounds represented by the following general chemical formulas:

Si(OR)$_4$

Ge(OR)$_4$

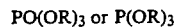

PO(OR)$_3$ or P(OR)$_3$

B(OR)$_3$ (in these formulas, R represents an alkyl group having 4 or less carbon atoms or a derivative thereof).

Alternatively, a siloxane compound such as a chain siloxane or cyclic siloxane may be used as a silicon source.

The chain siloxane may be represented by the following general formula:

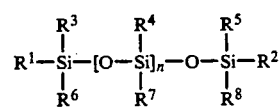

in the formula R$^1$, R$^2$, R$^3$, R$^4$, R$^5$, R$^6$, R$^7$ and R$^8$ represent alkyl groups containing 4 or less carbon atoms or derivatives thereof, respectively), for example, hexamethyldisiloxane (HMDS):

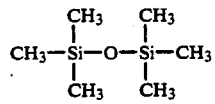

The cyclic siloxane may be represented by the following general formula:

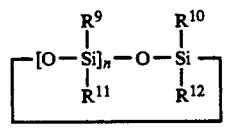

(in the formula, R$^9$, R$^{10}$, R$^{11}$ and R$^{12}$ represent alkyl groups containing 4 or less carbon atoms or derivatives thereof, respectively), for example, octamethylcyclotetrasiloxane (OMCTS):

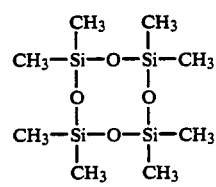

These compounds form a CVD glass film at a temperature up to 800° C. by thermal decomposition or by adding O$_2$, and also form a low temperature CVD glass film at a temperature up to 400° C. by adding O$_3$.

In the experiments performed by the inventor of the present invention, a thin glass film composed of a two component system of SiO$_2$-GeO$_2$ was formed on a substrate by a low temperature CVD reaction under atmospheric pressure at 400° C. through the reaction of Si(OR)$_4$-Ge(OR)$_4$-O$_3$ system. As a result, it has been found that the refractive index, the stress, the density and the like of the resultant thin glass film depend on the added quantity of GeO$_2$.

In particular, when GeO$_2$ was added to the extent that a 40% mol ratio is not exceeded, the result is an interlevel insulator film wherein:
  the cracking limit is increased,
  Al hillocks are not formed,
  self-flattening is increased,
  the density of the film is increased, and
  the stress is low, as compared with a conventional film of SiO$_2$ only.

As described above, the mixed glass film of SiO$_2$ and GeO$_2$ obtained in the present invention shows stable physical properties. It is conceivable that the film after formation has already a glass network construction since a mixed glass film is formed using organic sources of the glass film components and, thus, a more stable film has been formed.

However, when GeO$_2$ exceeds 50 mol %, the water resisting property of the film tends to deteriorate. Therefore, caution must be exercised that the quantity of GeO$_2$ added does not exceed that limit.

Further, a thin glass film (a GBPSG film) composed of a four-component system was formed on a substrate by adding PO(OR)$_3$ and B(OR)$_3$ to the Si(OR)$_4$-Ge(OR)$_4$-O$_3$ system and by low temperature CVD reaction under atmospheric pressure at 400° C. In this case, although it depends on the quantity of phosphorus added, the reflow temperature falls by about 100° C. as compared with a conventional BPSG film formed with no germanium, and sufficient reflow was obtainable at 700° to 800° C.

With the foregoing, it is believed that the softening point of PSG has been reduced by adding $GeO_2$, but it is very effective if such a film is applied as an interlevel insulator between Al interconnection and the gate in a device of high density such as a DRAM requiring good coverage and low temperature processing.

BRIEF DESCRIPTION OF THE DRAWINGS

FIG. 7 is a table showing experimental results for the deposition rate, the composition ratio, the refractive index and the stress of a film formed by a method in accordance with the present invention;

DESCRIPTION OF THE PREFERRED EMBODIMENTS

An embodiment of the present invention will be described hereinafter with reference to the drawings.

(1) Description of an apparatus for forming an atmospheric pressure CVD film according to an embodiment of the present invention.

Figure 1:
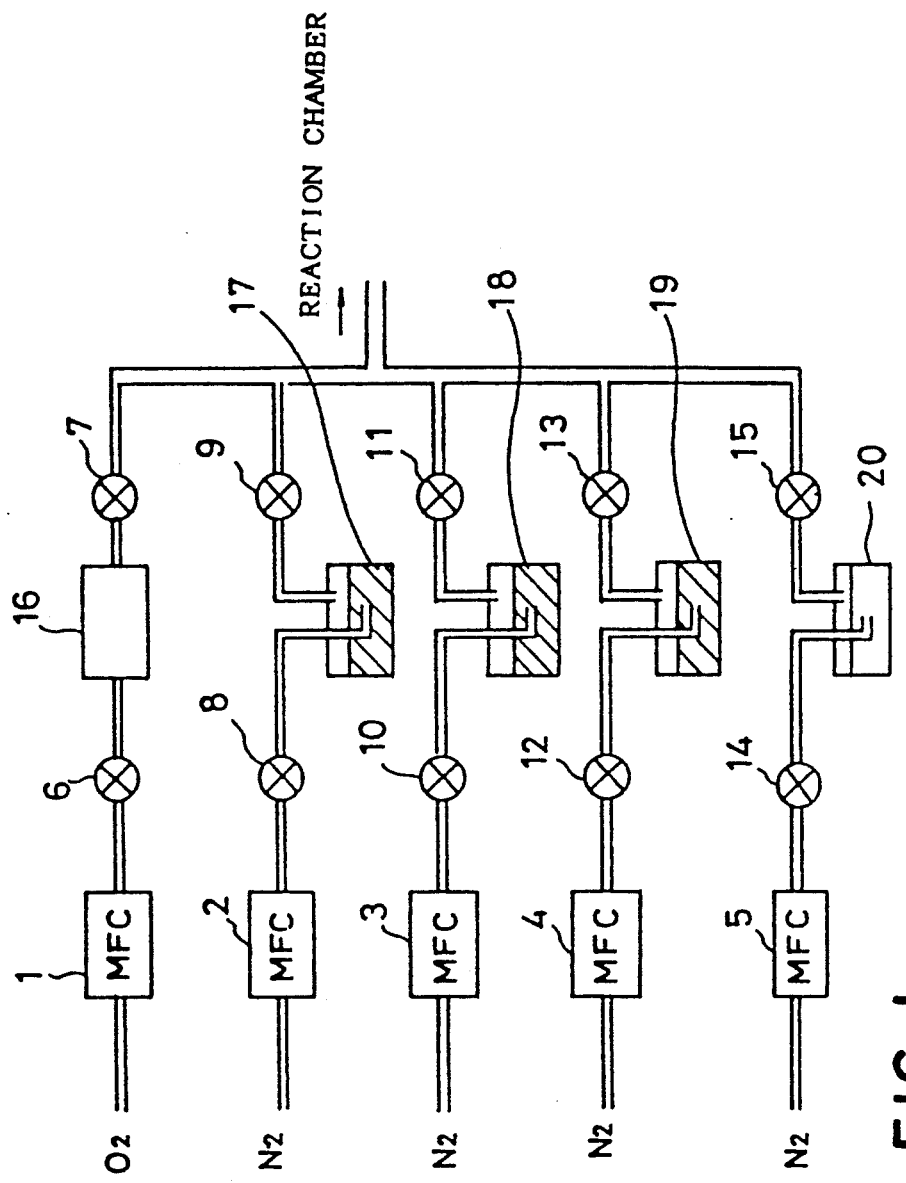
FIG. 1 is a schematic diagram of a gas-mixing system for forming a CVD film at atmospheric pressure according to an embodiment of the present invention.
Figure 2:
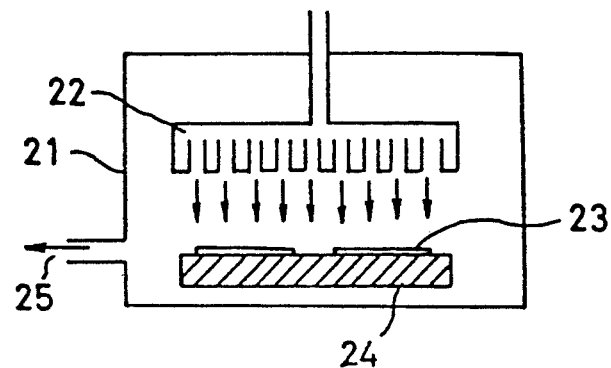
FIG. 2 is a schematic diagram of a reaction chamber for forming a CVD film at atmospheric pressure using mixed gas received from the apparatus of FIG. 1, according to an embodiment of the present invention.

FIG. 1 is a schematic block diagram showing an apparatus for mixing respective reaction gases used in a method for forming an atmospheric pressure CVD film according to an embodiment of the present invention, and FIG. 2 is a schematic diagram showing an apparatus for introducing mixed reaction gas into a reaction chamber so as to form a CVD thin glass film.

In FIG. 1, reference numerals 1 to 5 represent flow-meters (MFC), 6 to 15 represent valves, and 16 represents an ozonizer for changing oxygen ($O_2$) to ozone ($O_3$). 17 represents liquid $Si(OC_2H_5)_4$ as a silicon source. 18 represents liquid $Ge(OC_2H_5)_4$ as a germanium source, 19 represents liquid $PO(OC_2H_5)_3$ as a phosphorus source, and 20 represents liquid $B(OCH_3)_3$ as a boron source. The respective liquids are set at specific temperatures suitable for reaction.

Figure 5:
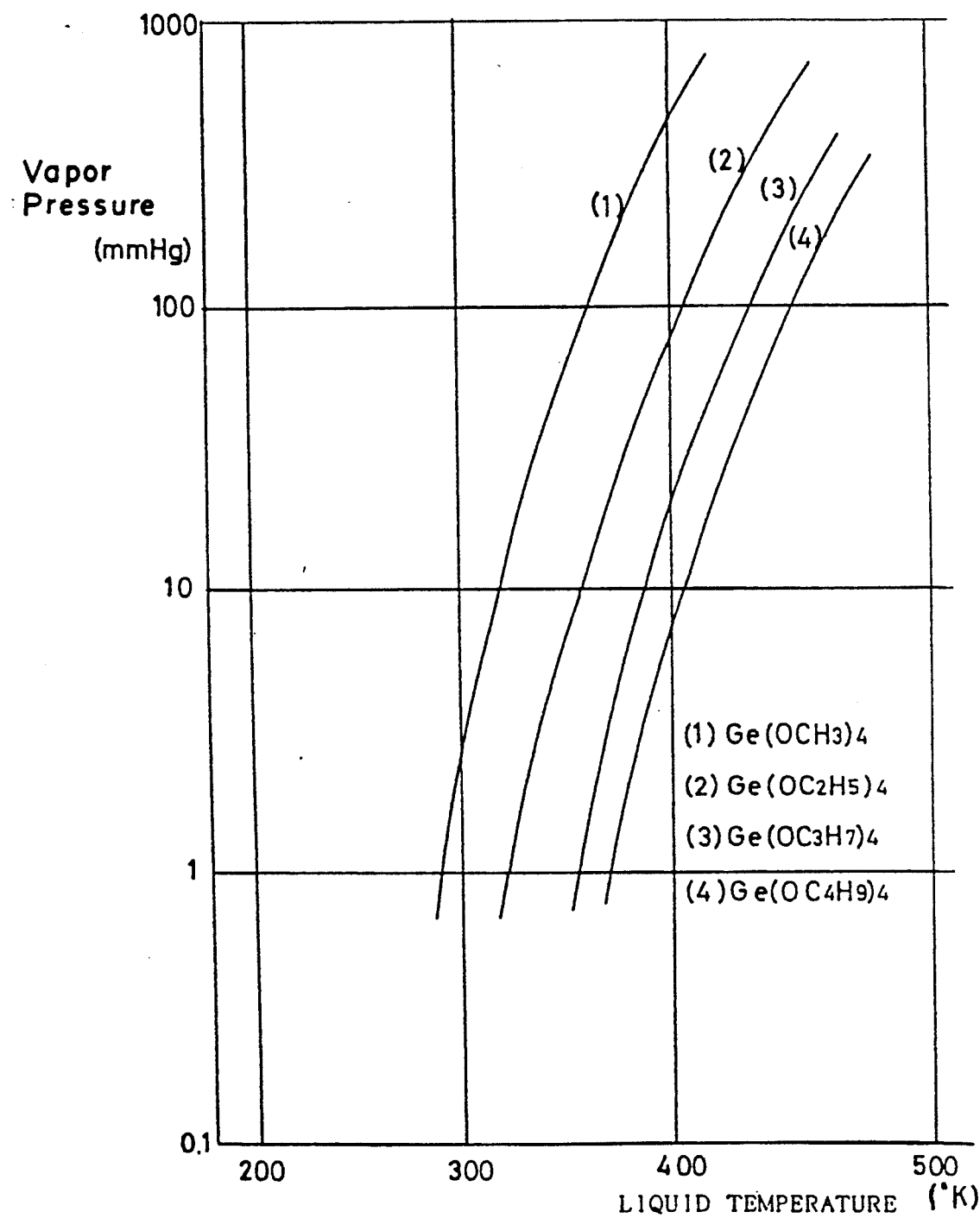
FIG. 5 is a graph showing the relationship between the liquid temperature and the vapor pressure of an alkoxy compound used as a silicon source.
Figure 6:
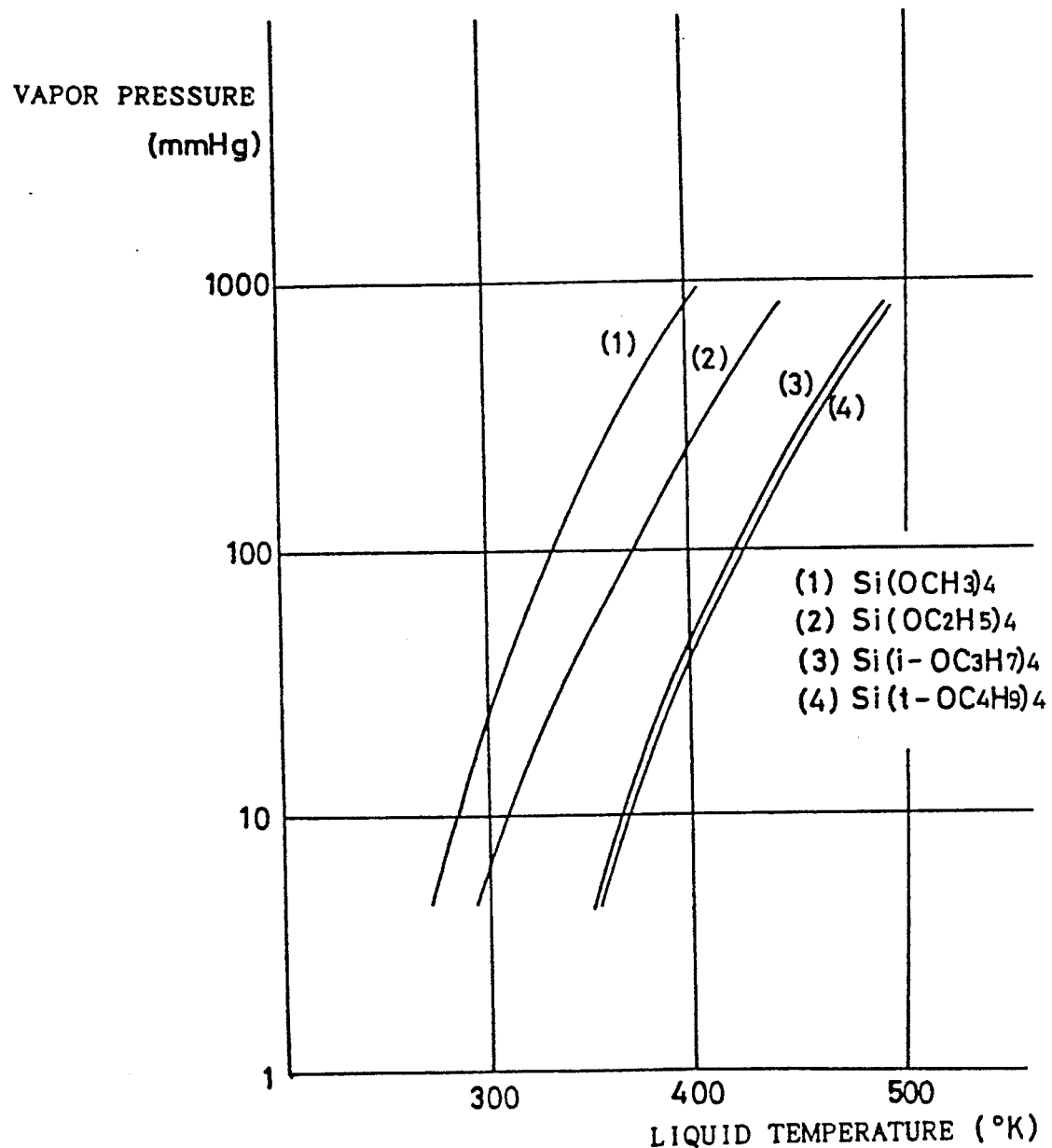
FIG. 6 is a graph showing the relationship between the liquid temperature and the vapor pressure of an alkoxy compound used as a germanium source.
Figure 8:
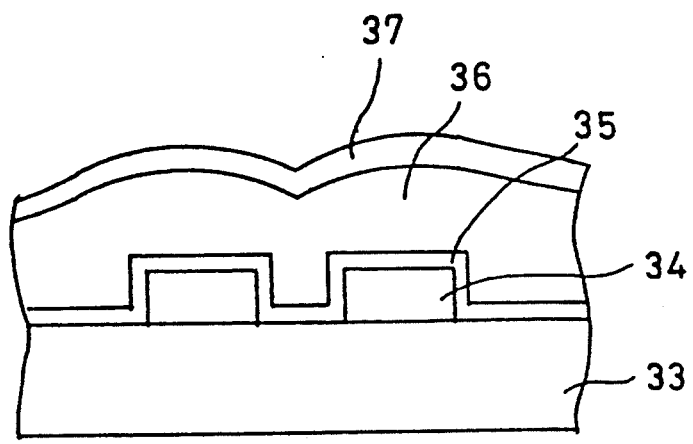
FIG. 8 is a schematic diagram of a cross-section of a conventional semiconductor device.
Figure 9:
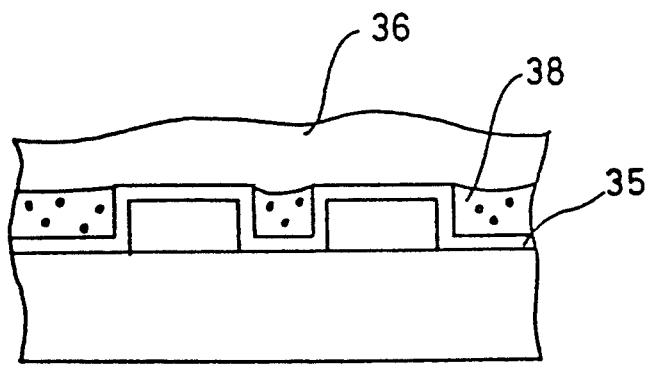
FIG. 9 is a schematic diagram of a cross-section of another conventional semiconductor device.

FIG. 5 shows the relationship between liquid temperatures and vapor pressures of various alkoxy compounds which may be used as the silicon source, and FIG. 6 shows the relationship between liquid temperatures and vapor pressures for the germanium source. As shown in these graphs, it is possible to set the vapor pressures of the respective gases by controlling the liquid temperature, thus making it possible to adjust the ratio of $SiO_2$ to $GeO_2$ and the deposition rate.

In FIG. 2, 21 represents a gas reaction chamber, 22 represents a gas outlet head for introducing the mixed gas onto a wafer surface in the chamber, 23 represents a wafer, 24 represents a heater for maintaining the wafer 23 at a predetermined temperature and 25 represents a gas discharge port.

(2) Description of a method for forming an atmospheric pressure CVD film according to an embodiment of the present invention.

Figure 4A:
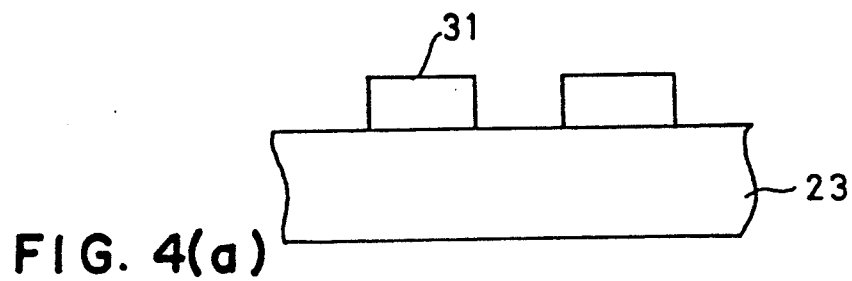
FIGS. 4(a), 4(b) and 4(c) are a series of schematic diagrams illustrating a method for manufacturing a semiconductor device according to an embodiment of the present invention.

Next, a method for forming an atmospheric pressure CVD film according to an embodiment of the present invention using the apparatus shown in FIG. 1 and FIG. 2 will be described with reference to FIG. 4. The wafer 23 shown in FIG. 4(a) is the same as the wafer 23 shown in FIG. 2, and Al interconnections 31 in a lower layer are formed on the wafer 23.

(1) Formation of a Germanosilicate Glass (GSG) film on the wafer 23.

When a GSG film is formed on the wafer 23, the temperature of the wafer is set to 400° C. by the heater 24, and oxygen ($O_2$) at 3 standard liter/min (3SLM) is fed by opening the valves 6 and 7 so as to generate 4% ozone ($O_3/O_2$) in the ozonizer 16. Valve 8 is then opened so as to feed carrier gas $N_2$ at 4SLM into the liquid $Si(OC_2H_5)_4$ (silicon source) 17 which is set at a liquid temperature of 65° C., to thereby generate gasified $Si(OC_2H_5)_4$ which passes through the valve 9. Furthermore, the valve 10 is opened so as to feed carrier gas $N_2$ at 1LSM into the liquid $Ge(OC_2H_5)_4$ which is set at the liquid temperature of 60° C., to thereby generate gasified $Ge(OC_2H_5)_4$. Then, these gases are fed toward the reaction chamber 21 while mixing, and discharged from the gas outlet head 22 onto the surface of the wafer 23.

Figure 4B:
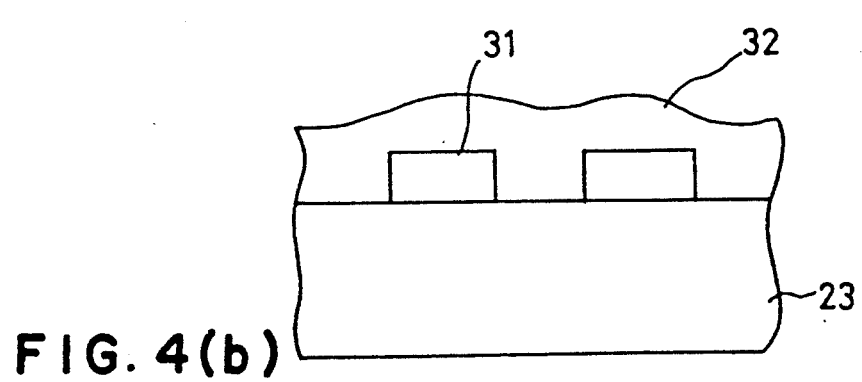

As indicated in FIG. 4(b), $Si(OC_2H_5)_4$ gas and $Ge(OC_2H_5)_4$ gas react with ozone on the surface of the wafer, and grow on the wafer surface at a deposition rate (film forming rate) of 1,000 Å/min. The refractive index of a film having the composition 50 mol % $SiO_2$ and 20 mol % $GeO_2$ was 1.48.

As described above, a method for forming a CVD film according to one embodiment of the present invention, forms a CVD film at a low temperature of 400° C. Thus, it is possible to reduce thermal stress applied to the Al film 31 in a lower layer, and to prevent the film quality from changing. Further, since the step coverage is also good, such complicated processes as that forming a plurality of CVD films one upon another or etch back are not required. Thus, it is possible to simplify the process of forming an interlevel insulator.

In particular, when it is required to improve the step coverage, further improvement of the step coverage is obtained by incorporating phosphorus or boron into the film by the methods described in the following paragraphs (2) and (3).

(2) When a Germano-Phospho-Silicate Glass (GPSG) film is formed on the wafer 23, the valves 12 and 13 are also opened to additionally feed $PO(OR)_3$ into the chamber 21, to thereby have ozone react with $Si(OC_2H_5)_4$, $Ge(OC_2H_5)_4$ and $PO(OC_2H_5)_3$ to deposit a GPSG film on the wafer.

When a Germanoborophosphosilicate Glass (GBPSG) film is formed on the wafer 23, all the valves 6 to 15 are opened so as to feed ozone, Si(OC$_2$H$_5$)$_4$, Ge(OC$_2$H$_5$)$_4$, PO(OC$_2$H$_5$)$_3$ and B(OCH$_3$)$_3$ into the chamber 21, to thereby deposit a GBPSG film on the wafer.

Figure 4C:
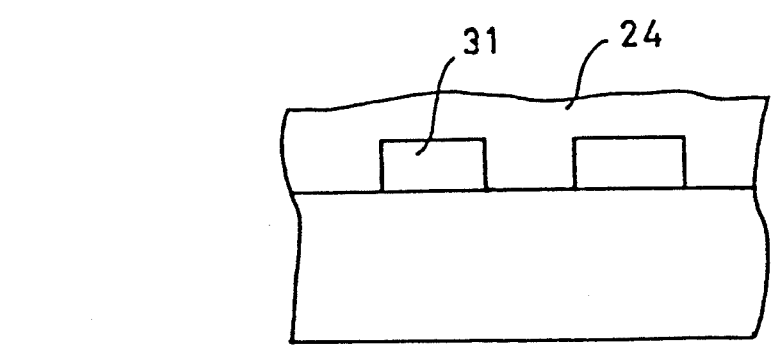

Flattening of the whole film may be achieved by applying reflow processing to the GPSG film and the GBPSG film formed by the methods described in (2) and (3), as shown in the process drawing of FIG. 4(c).

The reflow temperature in this case is approximately 700° to 800° C., and it is possible to lower the temperature by about 100° C. or more below that employed in conventional reflow processing.

Incidentally, in the embodiment described above, Si(OC$_2$H$_5$)$_4$ containing an alkyl group with 2 carbon atoms (ethoxy) is used as an organic silane compound (alkoxysilane), and Ge(OC$_2$H$_5$)$_4$ having 2 carbon alkyl (ethoxy) groups is used as an alkoxy compound of germanium. However, other alkoxysilanes and alkoxy compounds of germanium containing alkyl groups having 1–4 carbon atoms may be used, or an alkoxy compound containing a substituted alkyl group having 1–4 carbon atoms may be used.

Further PO(OC$_2$H$_5$)$_3$ containing an alkyl group having 2 carbon atoms and B(OCH$_3$)$_3$ containing an alkyl group having one carbon atom are used as an alkoxy compound containing phosphorus or boron, but other alkoxy compounds containing alkyl groups of 4 or less carbon atoms may also be used, or an alkoxy compound containing a substituted alkyl group having 4 or less carbon atoms may also be used.

While alkoxysilane is the silicon source mentioned above, chain siloxanes represented by the general formula:

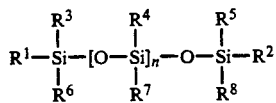

(wherein R$^1$, R$^2$, R$^3$, R$^4$, R$^5$, R$^6$, R$^7$ and R$^8$ alkyl or substituted alkyl groups having 4 or less carbon atoms), and cyclic siloxanes represented by the general formula:

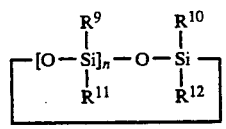

(wherein R$^9$, R$^{10}$, R$^{11}$ and R$^{12}$ are alkyl or substituted alkyl groups having 4 or less carbon atoms or derivatives thereof) may also be used.

(3) Experimental example of a method for forming an atmospheric pressure CVD film according to an embodiment of the present invention.

The experiment used:
TEOS (R=C$_2$H$_5$) as the source of SiO$_2$,
TMB (R=CH$_3$) as the source of B$_2$O$_3$,
TMOP (R=C$_2$H$_5$) as the source of P$_2$O$_5$, and
Tetraethoxy germanium (TEOG) (R=C$_2$H$_5$) as the source of GeO$_2$. A film was deposited with a deposition temperature of 400° C., an O$_3$ concentration of 4%, and with the following temperature/flow rates for the respective sources:
65° C./3.0SLM for TEOS,
10° C./0.13SLM for TMB,
60° C./1.8SLM for TMOP, and
60° C./0, 1, 2, 3, 4SLM for TEOG,
to thereby form five types of films. The deposition rate, the composition ratio, the refractive index and the stress were measured for each film.

As the result, the data shown in FIG. 7 were obtained. The composition ratio (mol %) was measured by Inductively Coupled Plasma Emission Spectrometry (ICP method), and the stress was measured on a film in the state as deposited.

The results show that the stress of a film is reduced and the refractive index is increased with the addition of GeO$_2$.

(4) Description of an apparatus for forming a low pressure CVD film according to an embodiment of the present invention.

Figure 3:
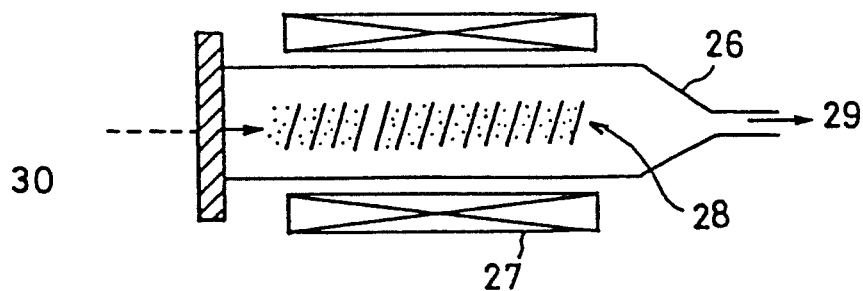
FIG. 3 is a schematic diagram of an apparatus for forming a CVD film at low temperature according to an embodiment of the present invention.

FIG. 3 shows a low pressure CVD apparatus of a hot wall system according to an embodiment of the present invention.

26 represents a quartz tube, 27 represents a heater furnace provided outside the quartz tube 26, 28 represents a plurality of wafers arranged transversely of the gas flow, and 29 represents a gas discharge port connected to a vacuum pump (not illustrated). Further, 30 represents mixed gas of oxygen (O$_2$), Si(OC$_2$H$_5$)$_4$ gas and Ge(OC$_2$H$_5$)$_4$ gas, or gas obtained by mixing PO(OC$_2$H$_5$)$_3$ gas, B(OCH$_3$)$_3$ gas and the like with the mixed gas as occasion demands.

(5) Description of a method for forming a low pressure CVD film according to an embodiment of the present invention.

A method for forming a low pressure CVD film according to an embodiment of the present invention will be explained with reference to the apparatus shown in FIG. 3.

(1) When a Germanosilicate Glass (GSG) film is formed on the wafer 28, the temperature of the wafer 28 is set to 750° C. by means of the heater 27, and the inside of the quartz tube 26 is evacuated by the vacuum pump to a pressure of approximately 1 to 2 Torr.

Next, when the mixed gas 30 is fed into the quartz tube 26 and reacted therein, a CVD film in accordance with the type and the ratios of the various components of the mixed gas is formed on the surfaces of the wafers 28.

A GSG film is deposited in the case where the mixed gas is, for example, Si(OC$_2$H$_5$)$_4$, Ge(OC$_2$H$_5$)$_4$ and O$_2$. A GPSG film is deposited in the case of Si(OC$_2$H$_5$)$_4$, Ge(OC$_2$H$_5$)$_4$, PO(OC$_2$H$_5$)$_3$ and O$_2$ and a GBPSG film is deposited in the case of Si(OC$_2$H$_5$)$_4$, Ge(OC$_2$H$_5$)$_4$, PO(OC$_2$H$_5$)$_3$, B(OCH$_3$)$_3$ and O$_2$.

In forming the low pressure CVD film, the film forming temperature is higher as compared with the temperature for forming an atmospheric pressure CVD film, but a plurality of wafers can be processed, thereby improving throughput.

As described above, according to the method for forming a CVD film of the present invention, it is possible to lower the temperature for film formation as compared with a conventional method of film formation. Thus, the method of the present invention is optimum for forming an interlevel insulator between Al and Al of a semiconductor device and for forming an interlevel insulator between Al and a gate.

Further, since an organic compound such as a siloxane or alkoxysilane, an alkoxy compound of germanium and an alkoxy compound containing at least either phosphorus or boron are used as the precursors of the CVD film, this method provides ease in handling and is suitable for mass production.

Furthermore, the softening point of the PSG film is reduced by introduction of GeO₃ into the CVD film (glass film). Thus, it becomes possible to lower the reflow temperature for flattening the film, and to reduce the influence of the temperature stress on the gate (polysilicon film, polycide film and the like) and the interconnection (Al film and the like). Further, the film quality is also good in terms of high density, high fineness and high reliability.

ADVANTAGES OF THE INVENTION

As described above, the method for forming a CVD film and the apparatus for manufacturing a semiconductor device according to the present invention are optimum for forming an interlevel insulator between Al and Al of a semiconductor device and forming an interlevel insulator between Al and a gate thereof, and also provide ease in handling and are suitable for mass production.

What is claimed is:

1. A method for forming a chemical vapor deposition thin glass film on a substrate comprising the steps of:

mixing, in vapor phase, (1) an organic silane selected from the group consisting of chain siloxanes represented by the general formula:

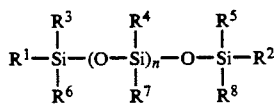

wherein $R^1$, $R^2$, $R^3$, $R^4$, $R^5$, $R^6$, $R^7$ and $R^8$ are alkyl groups having 1–4 carbon atoms or substituted alkyl having 1–4 carbon atoms and n is 0 or greater, cyclic siloxanes represented by the general

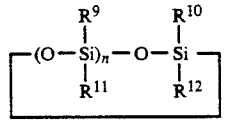

wherein $R^9$, $R^{10}$, $R^{11}$ and $R^{12}$ are alkyl groups having 1–4 carbon atoms or substituted alkyl having 1–4 carbon atoms and n is 1 or greater and alkoxysilanes represented by the general formula:

wherein R represents an alkyl group having 1–4 carbon atoms or substituted alkyl having 1–4 carbon atoms and (2) an alkoxy compound of germanium represented by the general formula:

wherein R is an alkyl group having 1–4 carbon atoms, to form a vapor phase admixture; and reacting said vapor phase admixture with ozone at atmospheric pressure, in the presence of the substrate, to form a thin glass film containing silicon oxide and germanium oxide on the substrate.

2. A method in accordance with claim 1 further comprising the step of:

adding a phosphorus compound to said vapor phase admixture, said phosphorus compound being selected from the group consisting of alkoxy phosphorus compounds, oxides of phosphorus and acid chlorides containing phosphorus, whereby said thin glass film additionally contains phosphorus oxide.

3. A method in accordance with claim 2 further comprising the step of:

adding a boron compound to said vapor phase admixture, said boron compound being selected from the group consisting of alkoxy boron compounds, oxides of boron and acid chlorides of boron, whereby said thin glass film is a germanoborophosphosilicate glass.

4. A method in accordance with claim 1 further comprising the step of:

adding a boron compound to said vapor phase admixture, said boron compound being selected from the group consisting of alkoxy boron compounds, oxides of boron and acid chlorides of boron, whereby said thin glass film additionally contains boron oxide.

5. A method in accordance with claim 2 wherein said phosphorus compound is PO(OR)₃ or P(OR)₃, wherein R is an alkyl group of 1–4 carbon atoms.

6. A method in accordance with claim 3, wherein said boron compound is B(OR)₃, wherein R is an alkyl group of 1–4 carbon atoms.

7. A method in accordance with claim 4, wherein said boron compound is B(OR)₃, wherein R is an alkyl group of 1–4 carbon atoms.

8. A method for forming a chemical vapor deposition thin glass film on a substrate comprising the steps of:

mixing, in vapor phase, (1) an organic silane selected from the group consisting of chain siloxanes represented by the general formula:

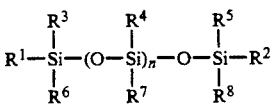

wherein $R^1$, $R^2$, $R^3$, $R^4$, $R^5$, $R^6$, $R^7$ and $R^8$ are alkyl groups having 1–4 carbon atoms or substituted alkyl having 1–4 carbon atoms and n is 0 or greater, cyclic siloxanes represented by the general formula:

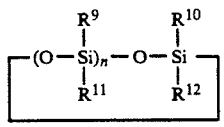

wherein $R^9$, $R^{10}$, $R^{11}$ and $R^{12}$ are alkyl groups having 1–4 carbon atoms or substituted alkyl having 1–4 carbon atoms and n is 1 or greater and alkoxysilanes represented by the general formula:

wherein R represents an alkyl group having 1–4 carbon atoms or substituted alkyl having 1–4 carbon atoms and (2) an alkoxy compound of germanium represented by the general formula:

wherein R is an alkyl group having 1-4 carbon atoms, to form a vapor phase admixture; and reacting said vapor phase admixture with oxygen, in the presence of the substrate, to form a thin glass film containing silicon oxide and germanium oxide on the substrate.

9. A method in accordance with claim 8 further comprising the step of:

adding a phosphorus compound to said vapor phase admixture, said phosphorus compound being selected from the group consisting of alkoxy phosphorus compounds, oxides of phosphorus and acid chlorides containing phosphorus, whereby said thin glass film additionally contains phosphorus oxide.

10. A method in accordance with claim 9 further comprising the step of:

adding a boron compound to said vapor phase admixture, said boron compound being selected from the group consisting of alkoxy boron compounds, oxides of boron and acid chlorides of boron, whereby said thin glass film is a germanoborophosilicate glass.

11. A method in accordance with claim 8 further comprising the step of:

adding a boron compound to said vapor phase admixture, said boron compound being selected from the group consisting of alkoxy boron compounds, oxides of boron and acid chlorides of boron, whereby said thin glass film additionally contains boron oxide.

12. A method in accordance with claim 9 wherein said phosphorus compound is $PO(OR)_3$ or $P(OR)_3$, wherein R is an alkyl group of 1-4 carbon atoms.

13. A method in accordance with claim 10, wherein said boron compound is $B(OR)_3$, wherein R is an alkyl group of 1-4 carbon atoms.

14. A method in accordance with claim 11, wherein said boron compound is $B(OR)_3$, wherein R is an alkyl group of 1-4 carbon atoms.

* * * * *

UNITED STATES PATENT AND TRADEMARK OFFICE
CERTIFICATE OF CORRECTION

PATENT NO. : 5,324,539
DATED : June 28, 1994
INVENTOR(S) : MAEDA et al

It is certified that error appears in the above-indentified patent and that said Letters Patent is hereby corrected as shown below:

Col. 9, line 37, after "general" insert --formula--.

Signed and Sealed this

Twenty-third Day of May, 1995

Attest:

Attesting Officer

BRUCE LEHMAN
Commissioner of Patents and Trademarks